(12) United States Patent
Foster et al.

(10) Patent No.: US 7,277,805 B2
(45) Date of Patent: Oct. 2, 2007

(54) JITTER MEASUREMENTS FOR REPETITIVE CLOCK SIGNALS

(75) Inventors: Samuel A. Foster, Oberlin, OH (US); Franco Motika, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 11/327,818

(22) Filed: Jan. 6, 2006

(65) Prior Publication Data

US 2007/0162240 A1    Jul. 12, 2007

(51) Int. Cl.
*G01R 13/00* (2006.01)

(52) U.S. Cl. ........................................ 702/69
(58) Field of Classification Search ................... 702/69
See application file for complete search history.

(56) References Cited

U.S. PATENT DOCUMENTS 7,158,899 B2 * 1/2007 Sunter et al. ................. 702/69
2004/0044488 A1 * 3/2004 Hanai et al. .................. 702/77
2006/0184332 A1 * 8/2006 Ishida et al. .................. 702/69
2006/0285584 A1 * 12/2006 Baumgartner et al. ...... 375/226
2007/0118316 A1 * 5/2007 Panis .......................... 702/69

FOREIGN PATENT DOCUMENTS

JP    2002-025194    * 1/2002

* cited by examiner

*Primary Examiner*—John Barlow
*Assistant Examiner*—Cindy D. Khuu
(74) *Attorney, Agent, or Firm*—H. Daniel Schnurmann

(57) ABSTRACT

A system and a method for measuring and quantitatively analyzing the jitter in repetitive electrical signals in a chip using a tester are described. The tester sorts chips based on the jitter measurements, thereby eliminating the need for external instrumentation. The waveform is sampled by the tester at various points of a period over a large number of periods and results are collected. The data is analyzed to determine the total range where the waveform is found to undergo a transition. The transition area is further analyzed to pinpoint the precise location of the transition for each period of the repetitive waveform. The data is used to quantify the jitter by means of statistical analyses, the results of which are used by the tester to sort the chips by comparing the calculated jitter characteristics to predetermined criteria.

20 Claims, 8 Drawing Sheets

WAVEFORM WITH 1 MILLION PERIODS
1 → 1,000,000

JITTER MEASUREMENTS FOR REPETITIVE CLOCK SIGNALS

BACKGROUND OF THE INVENTION

The invention relates to a system and method for measuring jitter in repetitive electrical signals, and more particularly, to measuring and quantitatively analyzing the jitter in clock signals using a tester to easily sort chips based on the jitter measurements, thereby eliminating the need for external instrumentation.

A phase-locked loop (PLL) is a component that is commonly used in many circuit designs. A circuit of this kind typically synchronizes an input signal to an output signal. It operates such that the output signal tracks the input signal in phase or relative position of the waveform. The frequency can be the same, or by means of a divider or multiplier circuit, the input and output frequency may differ while still being synchronized in-phase. Jitter of the output of the clock signal in a PLL determines the quality and even the performance of the output signal and of any circuit depending thereof. Therefore, jitter measurements in a PLL become indispensable for any circuit design. Such PLL circuits have proven to be excellent vehicles for determining the presence of jitter and lend themselves as vehicles for sorting good chips from bad ones.

It is well known that the semiconductor industry constantly strives to achieve higher processing speeds in connection with computers, telecommunication equipment, and the like. The common factor which extends to all the technological fields strives to achieve an ever increasing transfer of large volumes of data at high speed. By way of example, microprocessors move data at speeds which are based on high frequency clocks that determine the rate at which electrical signals are clocked through the circuitry.

FIG. 1 shows a basic block diagram of a PLL. An input signal and an oscillator (feedback) signal are fed to a phase detector. The input is the signal to be synchronized with, while the feedback from the voltage controlled oscillator (VCO) is the output signal to be synchronized with the input, provided the circuit operates correctly. The phase detector outputs a voltage through the loop filter that is proportional to the phase difference between the input and feedback waveforms. This proportional voltage is fed to the input of the VCO. The VCO frequency is controlled by the input voltage and its starting frequency approximates the input frequency of the phase detector. If the input and output are out-of-phase, the voltage from the phase detector causes the VCO output to shift and reduce the phase difference between the input and output. In this manner, the phase detector constantly monitors and adjusts the frequency of the VCO to maintain the phase difference between the input and output at zero. When the phase difference between the two signals is zero, the output is said to be locked.

A PLL is commonly used to stabilize the clock signals, multiply their frequency, synchronize different parts of the circuit, synchronize one chip with another, clean up the signals, and numerous other similar applications. It offers a clean and stable reference signal. The benefits of a PLL depend on many factors, such as how quickly it responds to differences in its phase and adjust its output, what range of input frequencies it handles without losing its locking capabilities, how much noise or jitter exists on the output signal, and the like.

Jitter is a measure of the timing instability in a waveform or circuit. It is the variation from an ideal waveform that is caused by electrical changes, design problems, characteristics of components in a system, or other similar problems. Unexpected changes in frequency, pulse length, and phase are indicative of the presence of jitter. Jitter becomes more significant at higher speeds since the same jitter comprises a larger proportion of the overall signal. Circuits that are time dependent, particularly when they operate at high frequencies, are especially susceptible to problems of jitter.

Microprocessors typically use an on-chip clock signal provided with a PLL. Because multiprocessor systems are commonly used, the timing of events is critical. Conventional systems are configured having a plurality of processors running in parallel, sharing and swapping data and commands to accomplish the computing task. Data is transferred via data busses which are synchronized between the many processors to ensure proper data transfer. Any problem with the data bus results in incorrect data at the other end. Thus, PLL is advantageously used to synchronize different chips attached to the data bus.

As mentioned previously, PLLs are particularly susceptible to jitter. Small amounts of jitter may go unnoticed, but at high speed, jitter on the PLL causes data transfer errors. Redesigning the PLL or the system may normally be an option, but often the problem is not discovered until the system is shipped to a customer when it is no longer feasible to redesign. A way to measure and categorize the jitter is the next best option so that only good chips are used to ensure a good product.

Signal integrity analyzers and other special equipment exist to perform a quick jitter analysis of signals, but this approach is both costly and complicated, especially in a manufacturing environment. Added to the cost of the equipment there is additional time and cost associated to connecting other components to an existing tester, integrating systems, and ensuring proper operation. Preferably, the best approach is to use an existing production logic tester without any additions. It lowers the test cost, reduces the number of necessary components, and allows the use of equipment as it exists

OBJECTS AND SUMMARY OF THE INVENTION

Therefore, it is an object of the invention to provide a method for measuring jitter in repetitive signals, such as clock signals, using only a tester, and without requiring any added external instrumentation.

It is another object to provide a process for quantitatively analyzing the jitter to sort chips as good or bad based on the results of the jitter measurements.

The invention provides a method for testing chips by measuring jitter on repetitive waveforms generated by a circuit integral to the chip, the waveforms being inputted into a tester coupled to the chip, the method including the steps of: a) determining where the waveform generated by the circuit undergoes a transition; b) taking a plurality of measurements from the waveform at periodic time intervals, the measurements being taken in a region where the waveform undergoes the transition; c) analyzing the measurements taken from the region to quantify the transition and calculating a jitter on the waveform; and d) sorting the chips according to the jitter.

BRIEF DESCRIPTION OF THE DRAWINGS

The accompanying drawings, which are incorporated in and which constitute part of the specification, illustrate presently preferred embodiments of the invention which, together with the general description given above and the detailed description of the preferred embodiments given below serve to explain the principles of the invention.

DETAILED DESCRIPTION

The invention provides a solution to the above problems by way of a novel method for measuring the jitter and assessing its effect. The ensuing analysis and evaluation will be described using for illustrative purposes only, a Teradyne tester J973. The concept applies to other test platforms besides the Teradyne tester and other waveforms besides PLL clock signals.

Figure 1:
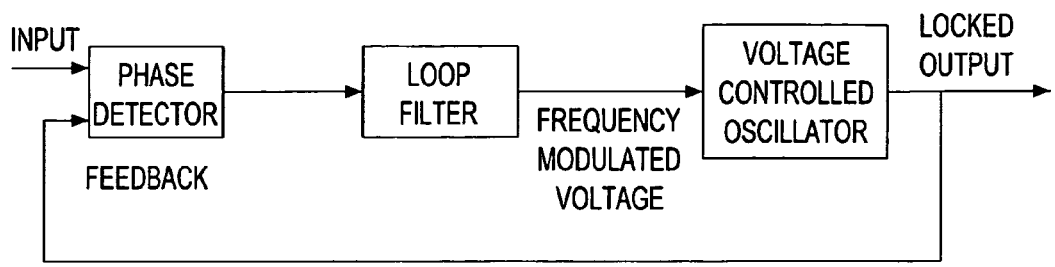
FIG. 1 illustrates a conventional PLL circuit used for illustrative purposes as a source of repetitive electrical signals.
Figure 2:
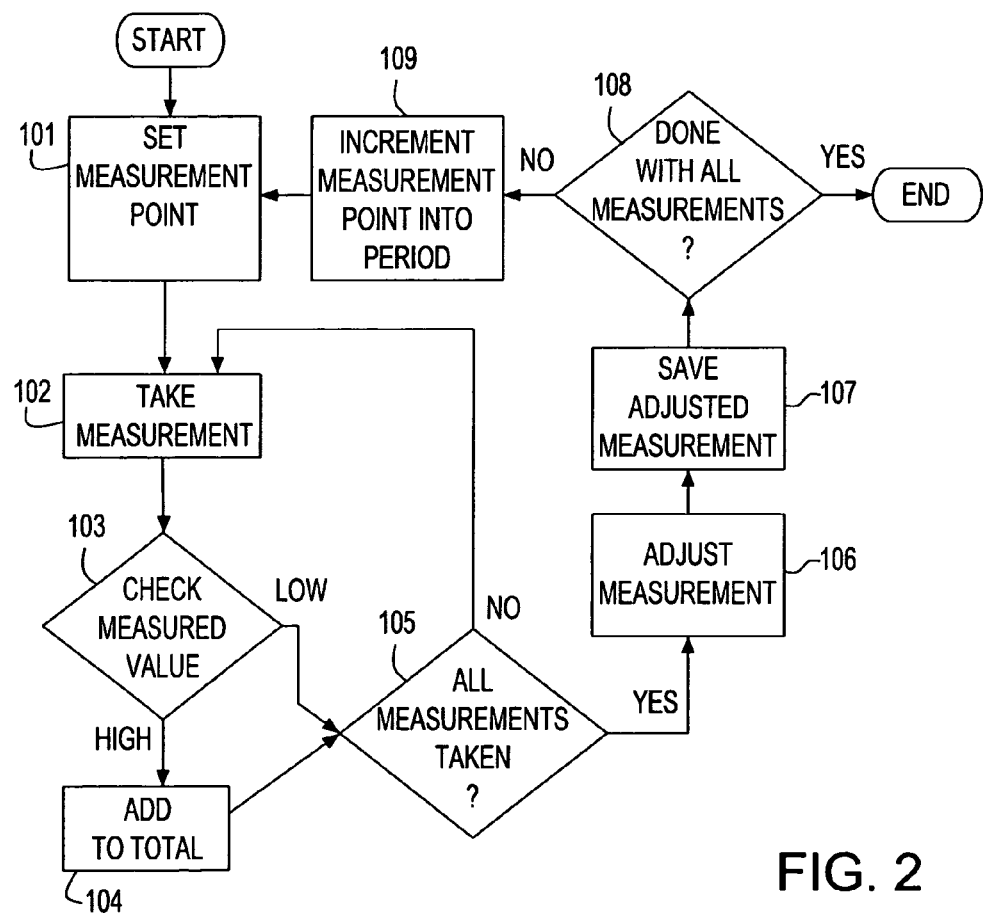
FIG. 2 is a flow chart that illustrates the preferred embodiment of the present invention.

The basic flow chart representing the preferred embodiment of the present invention is illustrated in FIG. 2. Shown are the actual steps to perform the necessary measurements. Alongside with the step embodying the present invention will also be shown accompanying examples to provide a proper understanding of what happens at the various steps.

While the invention is preferably used to measure the jitter on any repetitive pulse string, for illustrative purposes, a phase locked loop (PLL) circuit will be used. The measurement of jitter will be performed on the tester, as previously stated.

The tester is used primarily to probe the chip and measure the output of the PLL integral to a microprocessor. The tester is configured so that it takes measurements at any point within the period and handles any voltage at a high or low value. For simplicity, the tester is preferably programmed such that for a 1.2 volt PLL waveform any voltage above 0.6 volts (as the high value), and below 0.6 volts (as a low value) will be measured. The tester is also programmed to measure any point within a period, preferably with a 10 ps resolution. It is further necessary that the microprocessor be powered and fully operational and that an output waveform be generated by the PLL.

The flow chart will now be described in detail with reference to FIG. 2.

A measurement point is initially set (Step 101). It provides a reference that pinpoints the location within the period at which the measurement points are to be taken. The tester is set to take measurements anywhere within the period. In the first occurrence through the flow, this step sets Measurement Point 1 (see FIG. 3).

In Step 102, the tester samples the waveform at the location specified in Step 101 by way of hardware that is configured to take the measurement at a precise location within the period, and at a threshold specified to differentiate between a low and high value. This threshold should approximately be one-half the maximum voltage of the waveform and must be constant throughout the duration of the jitter measurement.

Next, in Step 103, the measured value is checked. Therein, it is determined whether the value measured is above or below the threshold specified in Step 102. If it is above the threshold, it is labeled a high. If it is below, it is labeled a low. During this step, a decision is made. If the waveform is found to be at high, a branch to step 104 takes place. Otherwise, the flow moves to Step 105, omitting Step 104.

In Step 104, the total number of high measurements is incremented. Thus far, only the measurement point specified in Step 101 is accounted for. No account is made of any number of highs found at any other measurement point.

In Step 105, a check is made to determine whether all the measurements are accounted for. This number represents the total number of the measurements that are to be taken at the point specified in Step 101. Alternatively, the number of measurements may represent the number of periods to be sampled. By way of example, as will be shown hereinafter with reference to FIG. 14, a total of 1 million periods are sampled. Thus, in this step it is determined whether the 1 million samples have already been taken.

At Step 105 a new decision is made. If the prescribed number of measurements has not yet been completed, the chart returns to Step 102, taking additional measurements at the same measurement point on subsequent periods. However, if the number of measurements coincides with the number of periods required, a branch to Step 106 takes place.

In Step 106, the measurements are adjusted. Thereat, the number of highs that were accumulated from previous measurements at the Measurement Point specified in Step 101 is determined and adjusted as will be discussed hereinafter with reference to Table 2. The total number of measurements corresponds to a number found in the "Probability of a High" column in Table 2. The adjustment provides an equivalent number in the "Jitter" column. This number is derived by taking the difference of the current measurement and subtracting thereof the preceding measurement. For instance, if the total for the present measurement point is X and the preceding measurement point has a number of highs is Y, then the adjusted measurement is X-Y.

In Step 107, the adjusted measurement (X-Y) from Step 106 is stored in an array. The actual measurement X from Step 106 is temporarily saved so that it can be used to adjust the next number. It is this adjusted value X-Y that is used to calculate the jitter.

In Step 108, a decision branch determines whether additional measurement points are necessary. For instance, and with reference to FIG. 3 it is shown that 250 measurement points are taken across each period. Accordingly, in Step 108 it is determined whether measurement point 250 has been reached. If the answer is YES, the process comes to an END. Otherwise, a branch to Step 109 takes place and the process continues with additional measurements taken. Upon reaching END, the data is stored in the array to be used for subsequent data analysis.

In Step 109, the process returns to the beginning of the process, taking measurements at a new location, i.e., by incrementing the measurement point within the period.

Figure 3:
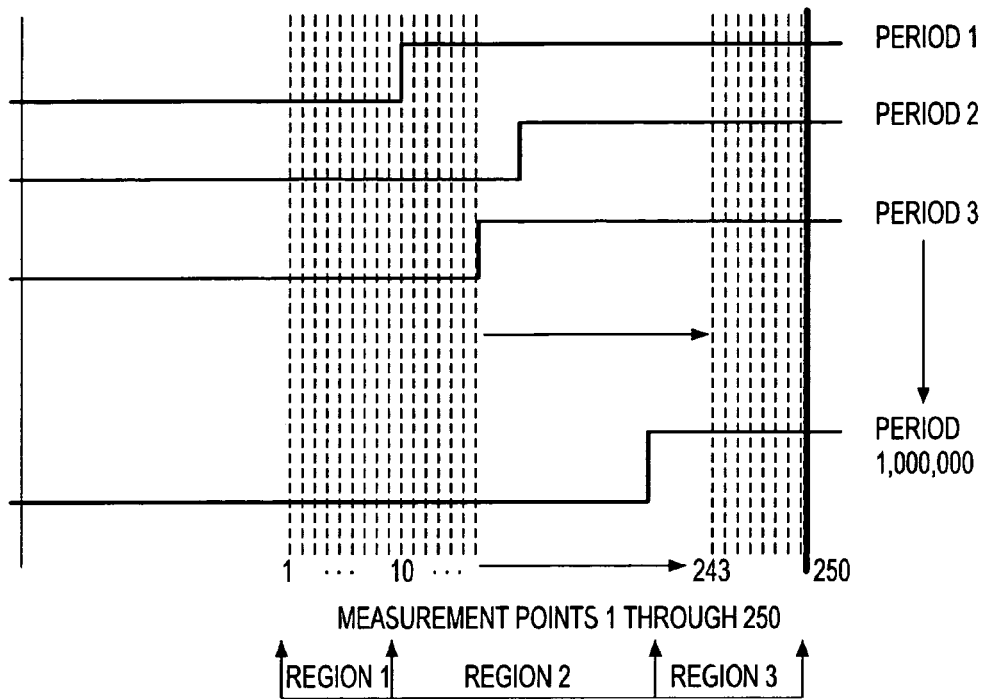
FIG. 3 is a waveform affected by jitter, wherein measurements are taken in three separate regions.

Still referring to FIG. 3, if the measurements were taken at Measurement Point 1, a new set of measurements is taken at Measurement Point 2. This step simply determines the next location where measurements within the period are to be taken. Then, the process returns to step 101 where this value is transferred to the tester (FIG. 4) and the waveform is measured.

Figure 5:
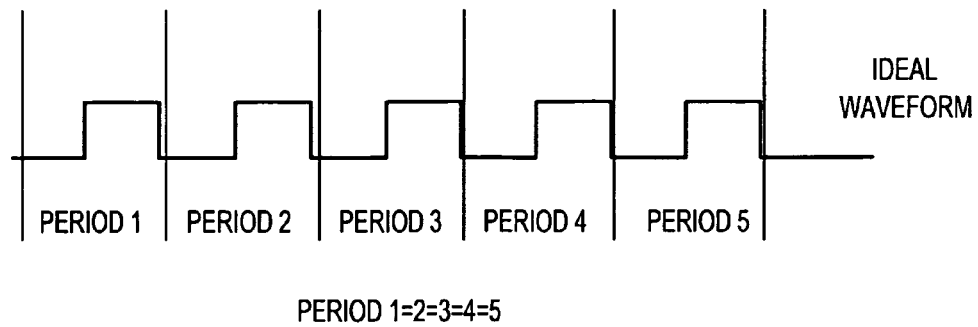
FIG. 5 is an example of an ideal waveform outputted by the PLL of FIG. 4.

As previously described, the jitter is defined as a deviation in the waveform pulse length or the phase from an ideal waveform. For reference purposes, an ideal waveform is shown with reference to FIG. 5. The period will always have the same length, the same applying also to the edge placement.

The waveform shown is preferably used for comparison to the waveforms outputted by the PLL. A reference point $T_0$ is labeled in each period thereof. This point is preferably selected to coincide in each period with the transition from low to high. Hereinafter $T_0$, when referenced, is intended to describe the location of the transition point in an ideal waveform. For a non-ideal waveform, the transition point will occur at some point other than $T_0$. The jitter of the non-ideal waveform is determined by the distance of the transition point from $T_0$ within the same period.

Figure 4:
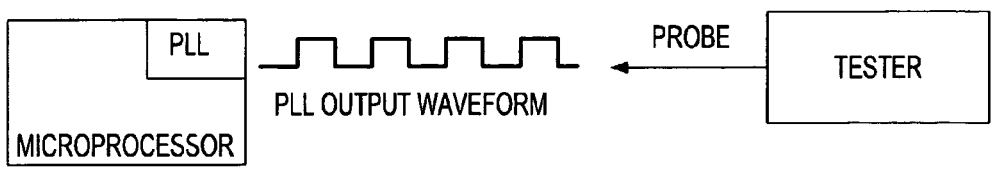
FIG. 4 illustrates the use of a tester to measure the jitter in signals generated by a PLL circuit integral to a microprocessor.

It is necessary, therefore, to define an ideal waveform and $T_0$ so that the jitter of the measured waveform may be calculated by reference thereof. In FIG. 4, there is no ideal waveform referenced by the tester that is associated with the waveform outputted from the chip. The tester samples a plurality of waveforms, and an ideal waveform is derived thereof. For illustrative purposes, referring to the Gaussian curve shown in FIG. 15 labeled "Unique Edges (Jitter)" and which will be described in more detail hereinafter, there is shown a graph of the distribution of multiple waveforms. The center or mean value of the curve is arbitrarily defined as $T_0$ or as the transition point of the ideal waveform. Any other waveform measured will have its jittered defined in relation to $T_0$. In this manner, it is not necessary to supply an external reference signal to the tester since the tester itself provides the reference. The ideal waveform will be defined after the measurements are collected.

Figure 6:
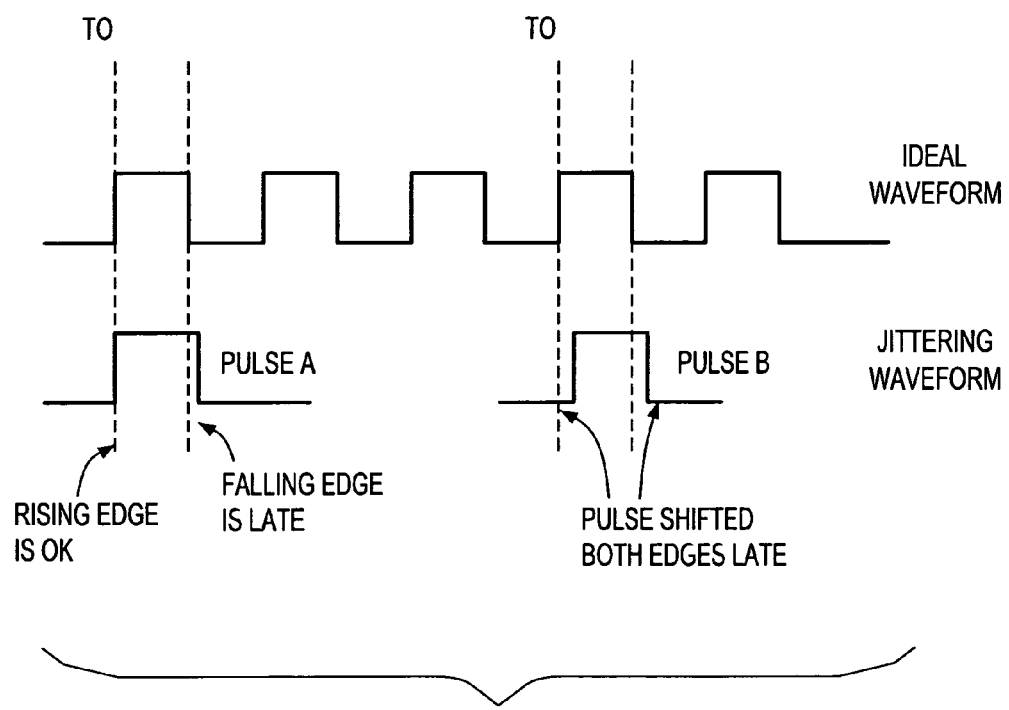
FIG. 6 shows the relative positioning of the ideal waveform of FIG. 5 showing how the pulses are displaced as a result of the jitter.

Jitter causes a lateral displacement of the edge of the waveform. It is caused by a change in the period or simply a phase shift. In either case, the edge placement of a jittering waveform differs from the edge placement of the ideal waveform, as seen with reference to FIG. 6. Therein is shown an ideal waveform at the top portion of the figure and two pulses below, i.e., pulses A and B. The pulses display different kinds of jitter. In pulse A, the rising edge matches the ideal waveform but the falling edge is delayed. In pulse B, both the rising and falling edges are delayed. Either edge of the pulse moves in either direction when the waveform jitters. It is this movement that is measured.

The present measurement technique involves sampling the waveform at various points. It is assumed for illustrative purposes, that only the high or low values are measured when sampled and further that the transition from high to low or low to high is always instantaneous. No measurement is to be performed at some unknown middle transition when it switches from high to low or vice versa. For the ideal waveform, this implies that as long as the same frequency is sampled as the waveform's, the same result will always be obtained.

Figure 7:
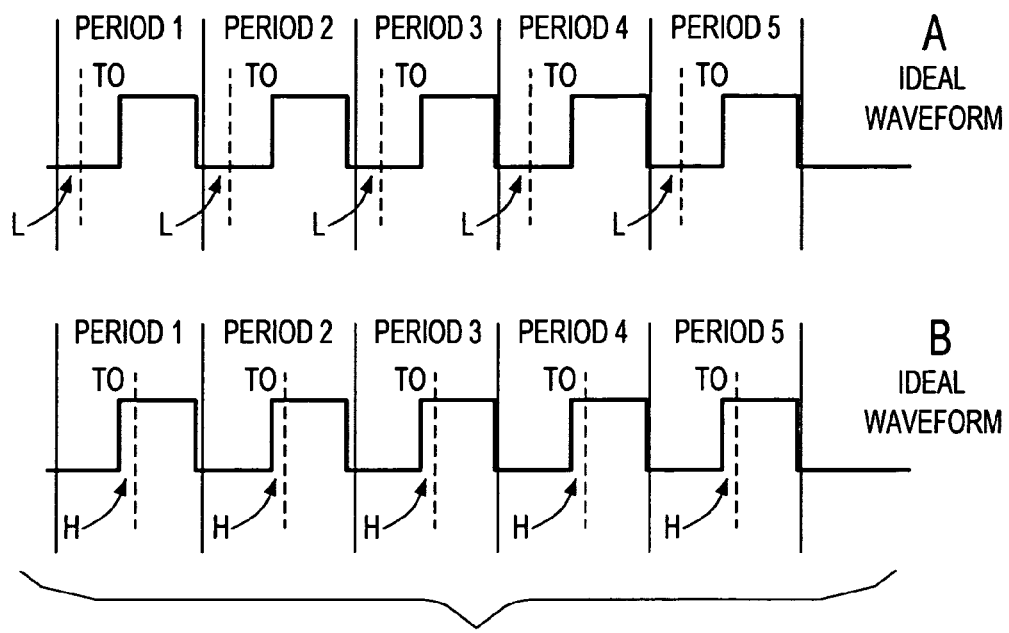
FIG. 7 illustrates two examples of the ideal waveform being measured, wherein the dotted lines indicate points at which the waveform is being sampled.

FIG. 7 illustrates two examples of the ideal waveform being measured. Hereinafter, and in all the figures, the dotted lines indicate the point(s) at which the waveform is sampled. The arrow(s) below and the letters "H" or "L" indicate if the result at that point is High (H) or Low (L). The solid vertical lines show the boundaries of each period. In FIG. 7A the waveform is sampled when the waveform is at low. In FIG. 7B, the waveform sampled is always high. Note that for FIG. 7A each subsequent period is sampled at the same relative location within the period. The same applies to FIG. 7B.

Figure 10:
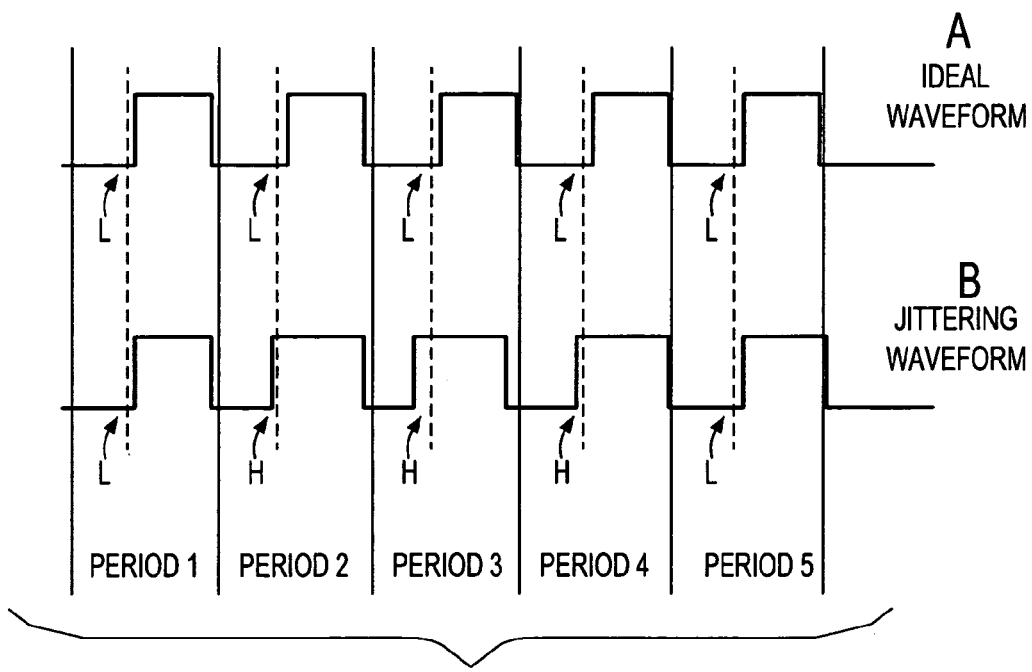
Figure 11:
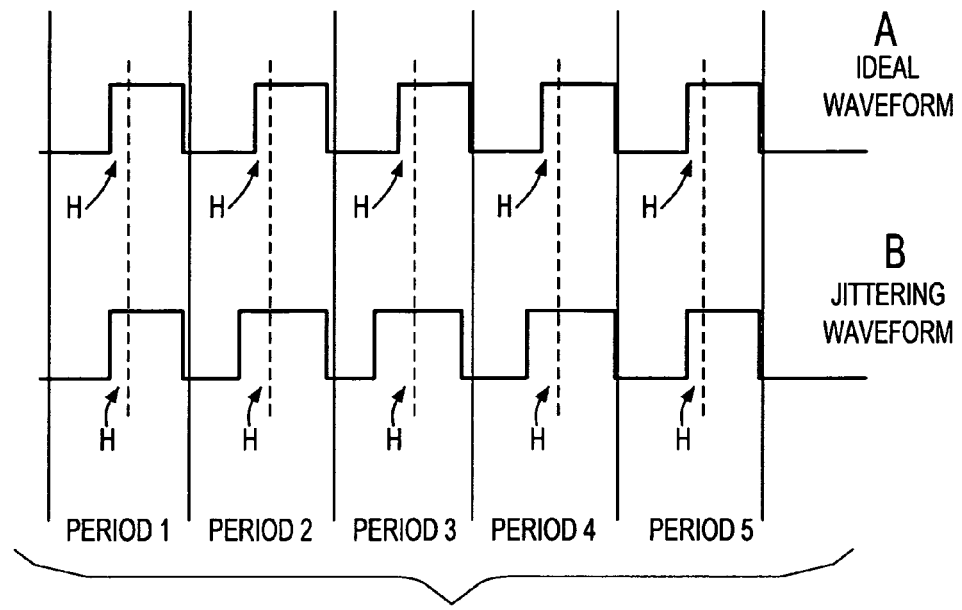

Now, comparing the aforementioned waveforms to one that is not ideal, when the jittering waveform is sampled at a given frequency, the same value will not always be measured. Depending on where the sample is taken, it may be at low or high, or only sometimes at low or high. FIG. 10 compares the ideal waveform to the jittering waveform, with both measured at the same points. In FIG. 10A, i.e., the ideal waveform, the values are all shown to be at low. However, in FIG. 10B, the measurement is not always at low even when sampled at the same position as in FIG. 10A. Periods 2, 3, and 4 are at high when measured, as a result of the jitter. Thus, jitter in the jittering waveform is detected when the measurement is taken.

At the measurement point illustrated in FIG. 10B, there is shown that three measurements out of five are at high. One may conclude that there exists $3/5$ or a 60% probability of finding the waveform at high. If the measurement were taken earlier or later in each period, the percentage of highs and lows would change. That percentage of high and low measurements is indicative of the number of times the edge of the waveform was on one side or the other of the sample point. It is further also related to the jitter and it is employed to measure it and evaluate it. Sampling at multiple different points yields a mathematical description of the probability of the waveform being at high at any given point. Accordingly, a measurement at the same location in a period taken across multiple periods may be advantageously used to describe the probability of the waveform being on one side or the other of the sample point. By taking many measurements at various points in each period, one may determine the probability of the waveform being at high or low at any point in the period. FIGS. 8 through 11 illustrate this occurrence. In each of the figures, the value is measured across five periods. At each time, the location for measuring the value is moved slightly to the right in the period.

Figure 8:
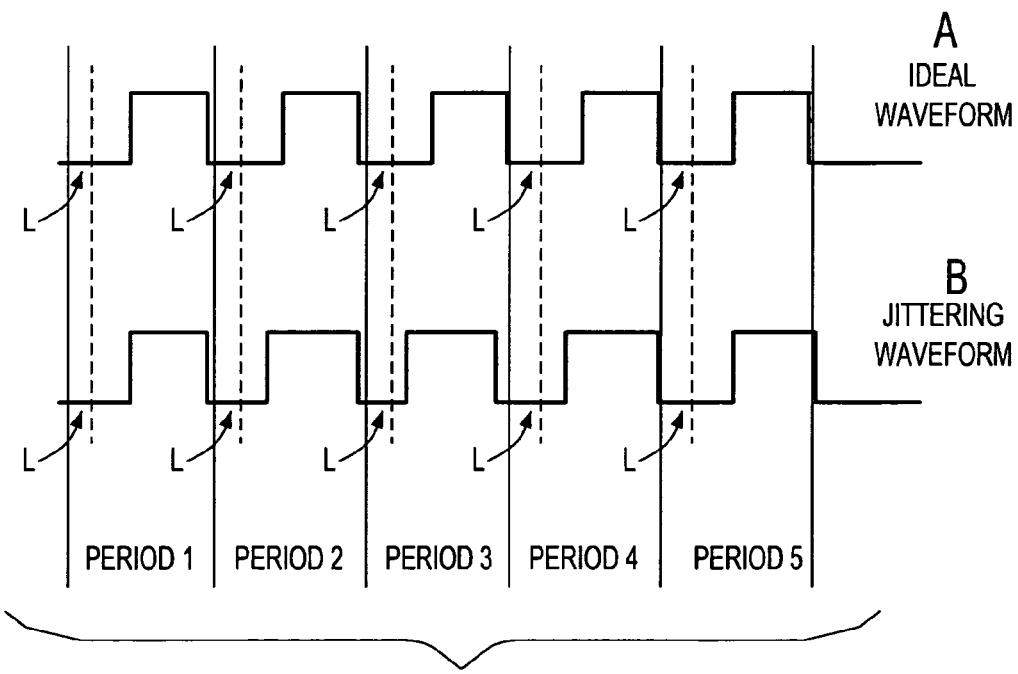
FIGS. 8-11 illustrate a data summary of the jittering waveform used to construct Table 1 using the number of high measurements, the number of samples given and the probability of the measurements being at high in order to calculate the jitter based on the edge locations of the ideal versus the jittering waveform.
Figure 9:
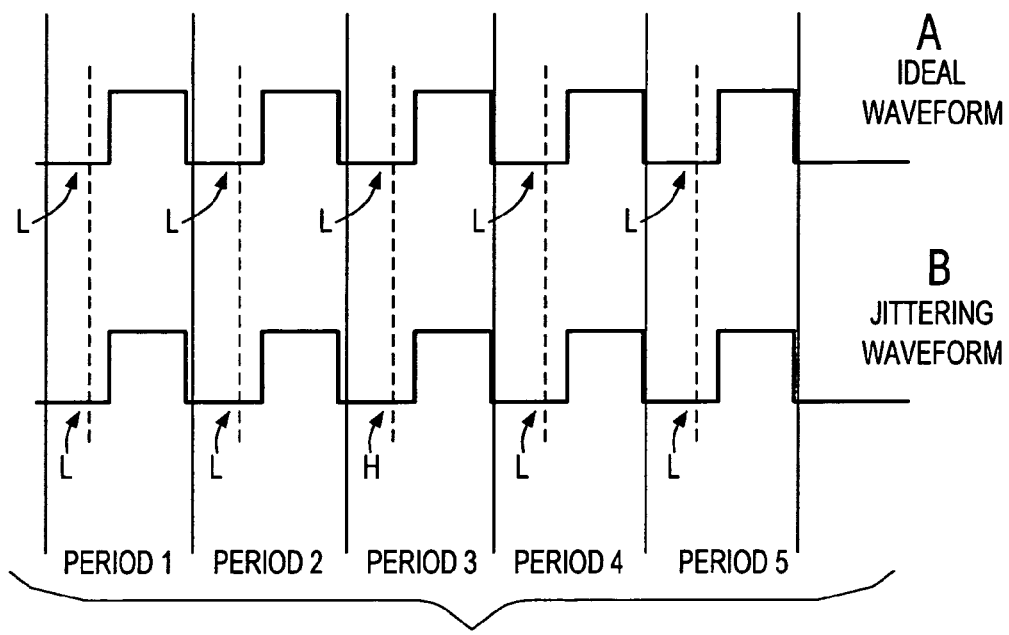

Referring to FIG. 8, the waveform is measured when it is always at low. The ideal waveform in FIG. 8A and the jittering waveform in FIG. 8B yield the same result. Periods 1 through 5 when measured are identical. This is not the case in FIG. 9, where the measurements differ. While FIG. 9A shows the ideal waveform always measuring at low, FIG. 9B shows that period 3 measures at high. FIG. 10 shows similar results. In FIG. 10A, the ideal waveform is always low even though it is substantially near to the transition point. In FIG. 10B, high values are measured in periods 2, 3, and 4. Finally, in FIG. 11, the boundary of the jitter has passed. Both FIGS., 11A and 11B, show that every measurement remains at high.

For the measurements illustrated in FIGS. 8B and 11B in which the jittering waveform is always depicted at high or at low, there is shown the minimum and maximum jitter. The middle two, FIGS. 9B and 10B, are within the boundaries of the jitter and the values measured are used subsequently for further analysis.

For the examples depicted in FIGS. 8 through 11, the data that summarizes the jittering waveform is shown in the Table 1 below:

TABLE 1

| | | | High/Total | Probability |
|---|---|---|---|---|
| FIG. 8b | H = 0 times | L = 5 times | 0/5 = | 0% |
| FIG. 9b | H = 1 time | L = 4 times | 1/5 = | 20% |
| FIG. 10b | H = 3 times | L = 2 times | 3/5 = | 60% |
| FIG. 11b | H = 5 times | L = 0 times | 5/5 = | 100% |

TABLE 2

| | Probability of High | | Jitter |
|---|---|---|---|
| FIG. 8b | 0% | (0%-0%) | 0% |
| FIG. 9b | 20% | (20%-0%) | 20% |
| FIG. 10b | 60% | (60%-20%) | 40% |
| FIG. 11b | 100% | (100%-60%) | 40% |

The number of high measurements divided by the number of samples gives the probability of the measurement being at high. This probability is related to the jitter even though it is not the actual jitter. The jitter is calculated by taking the difference in the edge locations of the ideal versus the jittering waveform. The distance that the edge moves represents the actual jitter.

Figure 12:
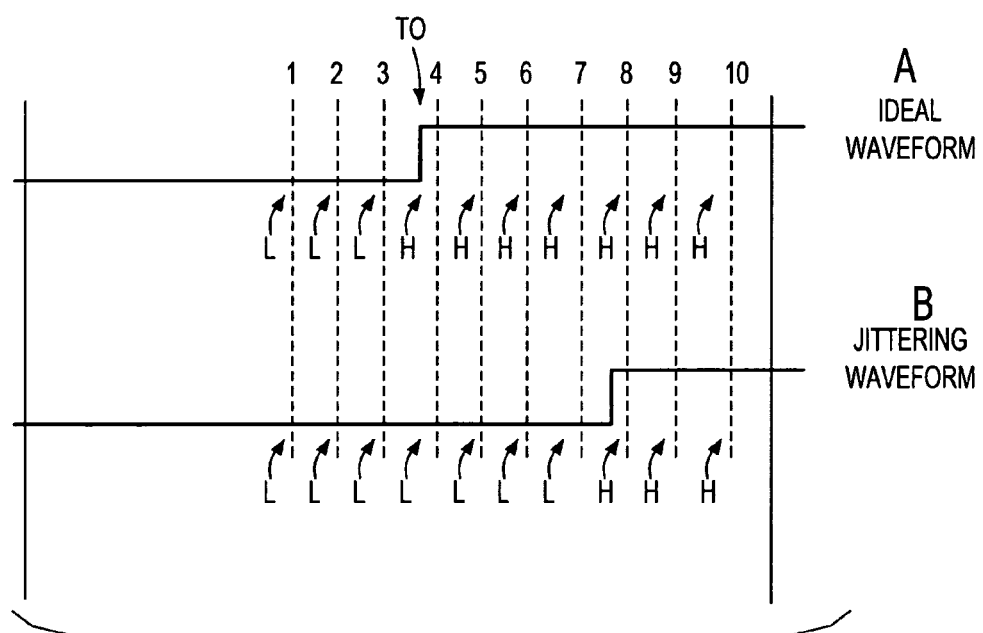
FIGS. 12A-12B show two waveforms, respectively sampled at 10 points illustrating transitions from a low to a high in the absence and presence of jitter, i.e., in an ideal and a jittering waveform.

To further clarify, and with reference to FIG. 12, there is shown the two waveforms, respectively in FIGS. 12A and 12B, with the waveforms sampled at 10 points. Between points 3 and 4 in FIG. 12A, a transition from a low to a high takes place. In FIG. 12B, the transition from low to high occurs between points 7 and 8. FIGS. 12A and 12B show the same waveform showing transitions at point 4 in FIG. 12A, and at point 8 in FIG. 12B. The difference between the positions of the two points represents the jitter. By way of example, if each measurement point in FIG. 12 is 0.1 second apart, then point 4 in FIG. 12A and point 8 in FIG. 12B are 4 points or 4×0.1 sec apart. Accordingly, there are 0.4 seconds of jitter in the waveform. Now, to further clarify its significance, and referring to point 9 in FIG. 12B, if the jitter is measured by way of point 8, the question arises as to whether point 9 should also be used to obtain another jitter value of 0.5 seconds. The answer is negative, and as such, the first transition of low to high becomes significant, while the following highs are not because they do not describe the jitter. Accordingly, it may be stated that at point 9 in FIG. 12B there is a 100% chance of the waveform being at high, which is illustrated in Table 1, although it cannot be consider jitter. Consequently, it becomes necessary to add a column to Table 1 to take this into account. If one were to subtract high values which do not show the jitter then the data would be deemed to be useful. Thus, any other high value in FIG. 12B that is measured, apart from point 8, can be discarded, retaining only the useful measurement attributed to point 8.

Referring again to the previous example with reference to FIGS. 8 through 11 and Table 1, and having now a clearer understanding of what the numbers represent, the chart is revised to show the actual jitter. With reference to Table 2, one may observe the number of times the waveform is at high. The second column represents the new value showing the actual jitter. It is obtained by taking column 1 and subtracting from each value the preceding value. For example, considering the probability of a high from rows 2 and 3 in Table 2, the resulting values are 20% and 60%, respectively. Subtracting 20 from 60 results in 40%, which is the value that is to be placed in the jitter column in the third row. 40% in the jitter column indicates that 40% of the edges fall uniquely into the measurement bracket. These are the edges or transition points of the waveforms.

Figure 13:
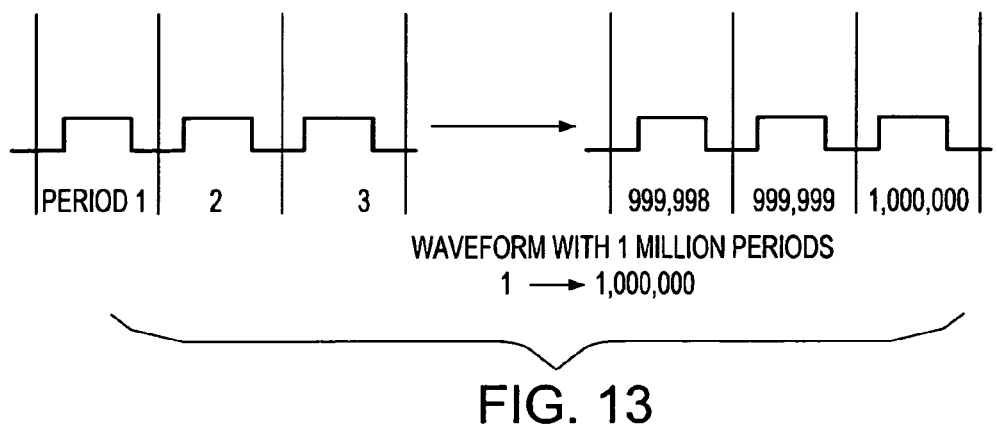
FIGS. 13-14 respectively show a waveform spanning over 1 million periods (FIG. 13), and the same waveform represented as 1 million individual periods (FIG. 14).
Figure 14:
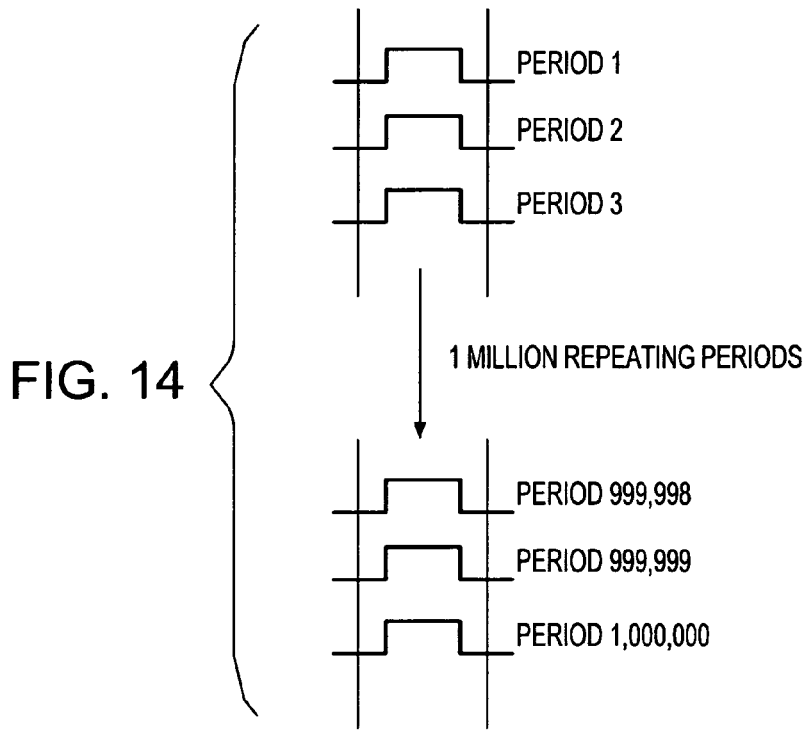

By measuring more periods at each measurement position and increasing the number of measurement positions as well, it is possible to measure the jitter very accurately. FIG. 13 shows a waveform for 1 million periods. This number of periods has been shown empirically and is deemed to be a suitable number for accurate measurement without incurring in an excessive measurement time. In FIG. 14 the same 1 million periods are shown in a different format. All the waveforms are identical. Now, assuming that jitter is detected in the waveform in FIG. 13. The result, when displayed in the same format as in FIG. 14, is shown in FIG. 3, wherein one waveform is measured over 1 million periods. In each period, the edge of the wave is at a different location. Instead of the measurement points used in the previous example additional measuring points a taken to obtain a finer resolution. The measurement points are labeled across the bottom of FIG. 3. There are 250 measurements taken across each period and labeled Measurement Points 1 through 250. Three regions are also labeled. Region 1 shows the area where none of the waveforms are at high. Measurement points 1 through 10 are in this region where they are always at low across the one million periods. In Region 2, the waveforms are sometimes at high and sometimes at low. In Region 3, the area where all of the waveforms measure at high has been reached. The significant region is Region 2 which is where the jitter exists. The left and right boundaries of Region 2 are respectively the minimum and the maximum jitter locations. All of the low to high transitions of the waveforms happen within Region 2.

Figure 15:
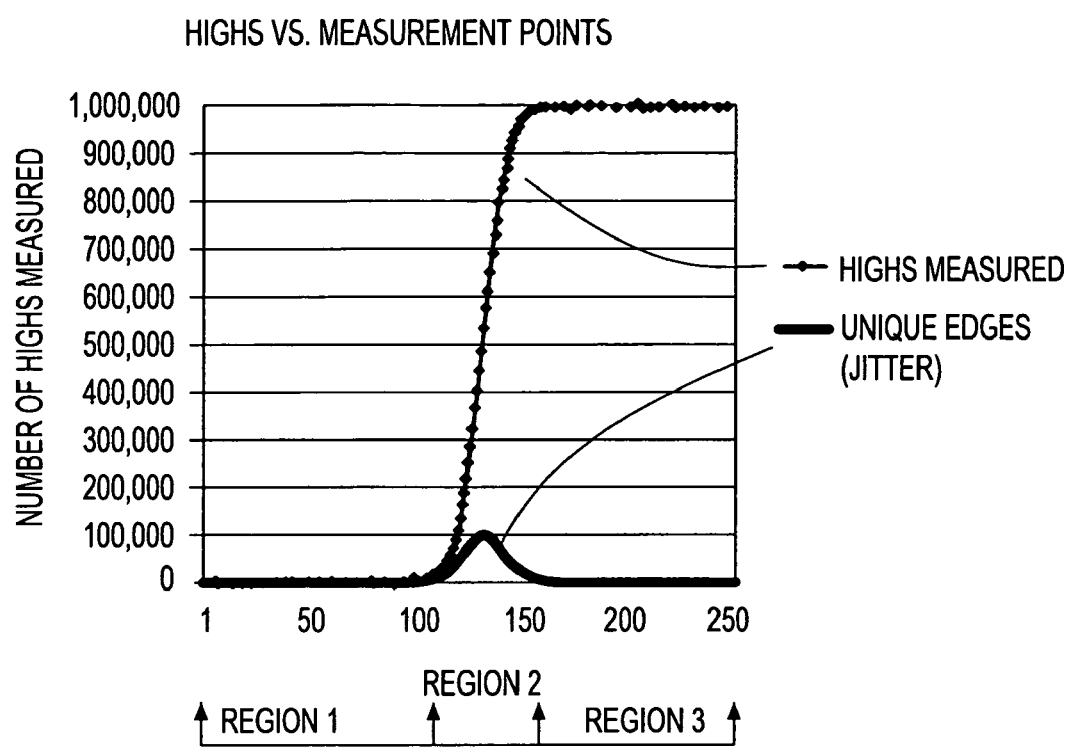
FIG. 15 is a chart plotting the number of highs vs. measuring points taken at 10 picosecond intervals for 1 million periods sampled at each position, and a second plot superimposed thereon showing the distribution of the jitter from multiple waveforms.

Now, with reference to FIG. 15 depicting a chart plotting the number of highs measured versus measuring points taken at 10 picosecond intervals for 1 million periods sampled at each position, there is shown different data that does not exactly match FIG. 3. The X axis shows the measurement position from 1 to 250 with each position taken at 10 picoseconds intervals. The Y axis indicates the number of times the value measures a high at that position. With particular reference to measurement point 1 on the far left of the X axis in FIG. 15 and with reference to FIG. 3 one observes where Measurement Point 1 is located within the period. One million periods are sampled at that same position. At each sample point it is determined whether the waveform is at low or at high. If the waveform is at high, it is added to the total number of highs measured. After 1 million periods, at Measurement Point 1 no high value has yet been measured. Thus, the total is 0. The Y axis in FIG. 15 shows that at point 1, there are 0 highs being measured. As one proceeds through measurement points 2, 3, 4, still no high values are detected across 1 million cycles. These measurement points form part of Region 1. Finally, at approximately Measurement Point 100, one begins to find a high value. This becomes the left boundary of what is labeled Region 2. As one continues to move to the right, more and more periods are found to be at high at each particular measurement point. Observing measurement point 125 on the X axis, it is determined that for Measurement Point 125 on the ascending line, "Highs Measured" corresponds roughly to 500,000 on the Y axis, "Number of Highs Measured." This indicates that at Measurement Point 125 a high value is measured approximately 50% of the time, or 500,000 out of 1,000,000 samples. As one proceeds across the X axis towards 156, the number of measured highs approaches 1,000,000. This is the point where measurements are taken over 1,000,000 periods and finding every one to be at high. This is the boundary of Region 3. One will never measure more than 1,000,000 since it is a sampling of 1,000,000 periods, and so the graph is limited at the top. Once a stable 1 million reading has been taken the far side of the jitter has been reached.

As one proceeds with the sampling, it is intuitive that as one moves from Region 1 where no waveform at high is found towards Region 3 where the waveform is always at high, an increasing number of high values will be encountered. This increase is illustrated in FIG. 15. In addition, the "Unique Edges" shaped as a Gaussian curve are shown concurrently in the Figure. This corresponds to the "Jitter" column in Table 2 which was discussed previously.

Referring now to previous discussion of Table 2 for the explanation of these numbers, it is observed that in FIG. 15 the "Unique Edges" curve at Measurement Point 125. At this point the number of "Highs Measured" is roughly located at the 100,000 mark on the Y axis. What this indicates is that at Measurement Point 125 there are 100,000 out of 1,000,000, or 10% of the edges that uniquely jittered at that point. If one measures at Measurement Point 125 over 1,000,000 periods one will find the waveform high 50% of the time (from "Highs Measured") but only 10% of the time will they be uniquely transitioning from low to high at Measurement Point 125.

At this point it is now possible to begin a statistical analysis. To calculate the mean the measurement point is first to be adjusted. Although points 1 through 250 have been labeled, in actuality they are time based measurements. Each measurement is 10 ps apart, and for the next steps they will be used in the same format. The Measurement Points in this table below are the time values. By way of example, $MP_1$ in the table below is 1×10 ps, or 10 ps. $MP_3$ is 3×10 ps, or 30 ps. When, finally, the results are obtained for the mean and standard deviation they will be in picoseconds.

| Measurement Point | Number of Unique Highs (Jitter) |
| --- | --- |
| $MP_1$ | $J_1$ |
| $MP_2$ | $J_2$ |
| $MP_3$ | $J_3$ |
| $MP_x$ | $J_x$ |

The standard formula for calculating the mean is:

$$\text{Mean} = \frac{\sum X}{N},$$

where X are the individual values and N is the sample size, or number of values.

The above formula must be adjusted slightly. For each Measurement Point, one million samples are preferably taken, thus weighting each Measurement Point. The value X in the standard formula is replaced by ($MP_X$ times $J_X$) Similarly, the number of samples in the denominator needs to be adjusted. It is not 250, the number of measurement points, but instead the total number of highs measured. The new formula is shown below.

$$\text{Mean} = \frac{\sum_1^X (MP_X * J_X)}{\sum_1^X J_X}$$

Recalling that at the beginning of the present discussion, $T_0$ was defined to be the mean value of the plurality of measurements, for the discussion that follows hereinafter, calculation of the mean will be omitted, and an estimate of its location places it at Measurement Point 125. Further analyzing FIG. 15, recalling that each measurement point stands 10 picoseconds apart, at Measurement Point 125 one is positioned at 125×10, or 1250 picoseconds into the period. One can then approximate the extent of the jitter. Region 2 in FIG. 15 begins at measurement point 100, ending at measurement point 156 (both approximations). So, the minimum jitter in the period is at point 100, i.e., 1000 picoseconds into the period, and the maximum jitter is 1560 picoseconds into the period. The total jitter is 1000-1560, or 560 picoseconds wide. (Note that minimum and maximum refer to the first and last locations within a period wherein a transition is found). The jitter at any particular measurement point may be determined by calculating the difference of its location in time from that of $T_0$, as previously discussed.

From the data collected it is further determined that:

| | |
| --- | --- |
| Minimum jitter | 1000 ps |
| Maximum jitter | 1560 ps |
| Total jitter | 560 ps |

The next piece of information that can be calculated is the standard deviation.

Using this mean one now calculates the standard deviation. The standard formula for calculating the standard deviation is as follows. Using the unbiased equation with N−1 instead of N in the denominator $$\text{Standard Deviation} = \sqrt{\frac{\sum (X - \text{mean})^2}{N - 1}}$$

In the case once again X is replaced by ($MP_X$ times $J_X$) and N with the sum of J values. The resulting equation is shown below.

$$\text{Standard Deviation} = \sqrt{\frac{\sum_1^X ((MP_X * J_X) - \text{mean})^2}{\left(\sum_1^X J_X\right) - 1}}$$

The numbers calculated must then be correlated to the hardware being tested. After testing multiple chips a correlation between good or bad chips and a certain level of jitter is found and the tester is programmed to sort out chips as good or bad depending on the level of jitter. These criteria are determined from real data and vary for each application of the present invention. It has been found that the standard deviation and the total (or peak) jitter are most useful in evaluating the chips tested.

For illustrative purposes, the example above was implemented using a Teradyne J973 tester. This method applies to other test platforms as well. On the J973 the implementation was as follows:

The tester is known to include a test pattern generator which contains the desired states of the various pins for the duration of the test, and a timing generator which takes the states of the pattern generator and places them precisely within the period, either for inputting data to the chip, or for reading values from the chip. The tester first initializes the chip and configures the PLL to run at the desired frequency. Then, the measurement circuitry reads the values in each period at a predetermined location (FIG. 2, Step 101). The tester cycles the chip continuously for a number of cycles to read one set of measurements (Steps 102 through 105). In the present example, 1 million cycles were chosen. The tester measures the pass and fails based on a comparison between the expected output of the chip and an actual output of the chip. In this instance, the tester was programmed to a low output. Thus, when the output of the PLL measured a high at the measured point it was labeled as a "fail." This is not indicative of an actual fail, simply a necessary way of programming due to the limitations of the test system and its intended use. These "fails" are in essence the high values collected throughout the test. Generally, the tester is programmed to detect a high, or fail, after the level of the PLL waveform passes a given threshold, e.g., 0.6 volts, or one-half the 1.2 volt peak-to-peak signal.

When the first 1 million measurements were collected, the tester analyzes the collected data to determine how many highs there are and that data is adjusted to find the unique edges (Step 106). This measurement is saved in the tester memory in an array and the test proceeds to the next measurement point. At the second measurement point, it is not necessary to reinitialize the chip, simply to continue the measurements as before, reading 1 million values and storing them in the memory. This process continues for as many measurement points as necessary until END is reached.

It is at this point that the tester determines the statistical values, the mean, minimum, maximum, standard deviation, and the like. These are calculated by the tester code, although other calculations can be programmed as well. The resulting values may also be stored in an off-tester database for analysis for future comparison to other chips. The values are then taken by the tester and compared to predetermined limits to determine if the chip is good or bad. In some cases, the standard deviation is used as a sorting criterion, in others the minimum or maximum, or the total jitter. The PLL may also be run at multiple frequencies with different configurations and those results compared. Regardless of the number of criteria, the tester compares its calculated values and determines sorting the chips accordingly. It is also possible to sort chips according to their jitter, rather than simply distinguishing as good or bad. Chips of like jitter may be grouped into different categories, allowing the criteria used to vary widely based on the specific application to which the method was applied.

The method as described presents numerous advantages, which include:

1) Measuring the jitter on repetitive signals such as clock signals by using existing testers;
2) Eliminating the need for external instrumentation and associated cost,
3) Quantitatively analyzing the jitter; and
4) Easily sorting chips as good or bad based on the results of the jitter measurement.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for testing a chip by measuring jitter on repetitive waveforms generated by a circuit integral to the chip under test, the waveforms being inputted into a tester coupled to the chip under test, the method comprising the steps of:
   a) determining where the waveform generated by the circuit undergoes a transition;
   b) taking a plurality of measurements from the waveform at periodic time intervals, said measurements being taken in a region where the waveform undergoes said transition;
   c) analyzing the measurements taken from said region to quantify said transition and calculating a jitter on said waveform; and
   d) having said tester sort the chip under test according to said jitter and record results of said sorting in a recording device.

2. The method as recited in claim 1, wherein step b) further comprises taking said plurality of measurements in regions where i) the waveform is always at low, ii) the waveform is always at high and iii) the waveform undergoes said transition.

3. The method as recited in claim 1 wherein said analysis comprises calculating the mean and standard deviation of said measurements.

4. The method as recited in claim 1 wherein said analysis comprises determining a minimum and a maximum value where said waveform undergoes said transition.

5. The method as recited in claim 1 wherein said analysis further comprises the step of accumulating said measurements of the waveform taken in the region where said transitions occur.

6. The method as recited in claim 1 wherein said measurements taken at periodic time intervals are ordered in a queue.

7. The method as recited in claim 6, wherein said measurements are correlated to the location within the period of the waveform where each measurement was taken.

8. The method as recited in claim 6 wherein said correlation is obtained by multiplying the position in said queue of each of said measurements by the length of said time interval.

9. The method as recited in claim 6 wherein jitter is measured as a distance by which an edge location of a jittering waveform is displaced with respect to the edge location of an ideal waveform, said jitter being the difference in the edge location of said ideal waveform from the edge location of said jittering waveform.

10. The method as recited in claim 9, wherein said ideal waveform is a waveform having a transition which is positioned at a statistical mean of a plurality of synchronized waveforms having the same period.

11. The method as recited in claim 10, wherein said ideal waveform is stored in said tester.

12. The method as recited in claim 1 wherein in step d) said sorting comprises the steps of:
   a) gathering and analyzing statistical data obtained from good and bad chips previously tested; and b) correlating the statistical data against the data of a chip under test.

13. The method as recited in claim 1 wherein in step a), said transition is detected when a predetermined voltage threshold is crossed.

14. A method for testing a chip by measuring jitter on repetitive waveforms generated by a circuit integral to the chip under test, the waveforms being inputted into a tester coupled to the chip, the method comprising the steps of:
  a) determining where the waveform generated by the circuit undergoes a transition, said transition taking place when said waveform crosses a predetermined voltage threshold;
  b) taking a plurality of measurements from the waveform at periodic time intervals, said measurements being taken in regions where i) the waveform is always at low, ii) the waveform is always at high and iii) the waveform undergoes said transition;
  c) analyzing the measurements taken from said regions and calculating a jitter on said waveform, said jitter being determined by a distance by which an edge location of a jittering waveform is displaced with respect to the edge location of an ideal waveform, said jitter being the difference in the edge location of said ideal waveform from the edge location of said jittering waveform, said ideal waveform being a waveform having a transition which is positioned at a statistical mean of a plurality of synchronized waveforms having the same period;
  d) having the tester sort the chips according to said jitter by gathering and analyzing statistical data obtained from good and bad chips previously tested, correlating the statistical data against the data of a chip under test; and recording results of said sorting in a recording device.

15. A program storage device readable by a machine, tangibly embodying a program of instructions executable by as machine to perform method steps for testing chips by measuring jitter on repetitive waveforms generated by a circuit integral to the chip, the waveforms being inputted into a tester coupled to the chip, said method steps comprising:
  a) determining where the waveform generated by the circuit undergoes a transition;
  b) taking a plurality of measurements from the waveform at periodic time intervals, said measurements being taken in a region where the waveform undergoes said transition;
  c) analyzing the measurements taken from said region to quantify said transition and calculating a jitter on said waveform; and
  d) having said tester sort said chips according to said jitter and record results of said sorting in a recording device.

16. A system for testing a chip by measuring jitter on repetitive waveforms generated by a circuit integral to the chip under test, the system comprising:
  a) a tester coupled to said chip under test; and
  b) a microprocessor comprising:
    i) means for determining where the repetitive waveform generated by the circuit undergoes a transition;
    ii) means for taking a plurality of measurements from the repetitive waveform at periodic time intervals, said measurements being taken in a region where the waveform undergoes said transition;
    iii) means for analyzing the measurements taken from said region to quantify said transition and calculating a jitter on said waveform, said tester sorting said chips under test according to said jitter.

17. The system as recited in claim 16, wherein in step c) said plurality of measurements are taken in regions where i) the waveform is always at low, ii) the waveform is always at high and iii) the waveform undergoes said transition.

18. The system as recited in claim 16, wherein said means for analyzing said measurements further comprises means for calculating the mean and standard deviation of said measurements.

19. The system as recited in claim 16, wherein said means for analyzing said measurements further comprises means for determining a minimum and a maximum value where said waveform undergoes said transition.

20. The system as recited in claim 16, wherein said means for analyzing said measurements further comprises means for accumulating said measurements of the waveform taken in the region where said transitions occur.

* * * * *